(12) United States Patent
Huang et al.

(10) Patent No.: US 9,904,332 B2
(45) Date of Patent: Feb. 27, 2018

(54) HEAT DISSIPATION MODULE, DISPLAY CARD ASSEMBLY AND ELECTRONIC DEVICE

(71) Applicant: GIGA-BYTE TECHNOLOGY CO., LTD., New Taipei (TW)

(72) Inventors: Shun-Chih Huang, New Taipei (TW); Tai-Chuan Mao, New Taipei (TW); Guang Bo Ning, New Taipei (TW)

(73) Assignee: GIGA-BYTE TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 15/235,119

(22) Filed: Aug. 12, 2016

(65) Prior Publication Data

US 2017/0108901 A1  Apr. 20, 2017

(30) Foreign Application Priority Data

Oct. 16, 2015  (TW) .............................. 104134117 A

(51) Int. Cl.
  *H05K 7/20* (2006.01)
  *G06F 1/20* (2006.01)
  *G06F 1/18* (2006.01)

(52) U.S. Cl.
  CPC ............... *G06F 1/20* (2013.01); *G06F 1/185* (2013.01); *H05K 7/2039* (2013.01); *H05K 7/20136* (2013.01)

(58) Field of Classification Search
  CPC ................................... G06F 1/20; G06F 1/185
  USPC ................... 361/695; 123/41.49; 165/104.33
  See application file for complete search history.

(56) References Cited

U.S. PATENT DOCUMENTS

| 4,797,600 | A  | * | 1/1989  | Savage | F01P 5/02 123/41.49 |
| 6,795,315 | B1 | * | 9/2004  | Wu     | G06F 1/20 165/104.33 |
| 6,804,115 | B2 | * | 10/2004 | Lai    | H05K 7/202 165/104.33 |

(Continued)

FOREIGN PATENT DOCUMENTS

| CN | 2645123 | 9/2004 |
| CN | 1723348 | 1/2006 |

(Continued)

OTHER PUBLICATIONS

"Search Report of European Counterpart Application," dated Feb. 20, 2017, p. 1-p. 9.

(Continued)

*Primary Examiner* — Nidhi Thaker
(74) *Attorney, Agent, or Firm* — JCIPRNET

(57) ABSTRACT

A heat dissipation module, including a heat sink set, a first fan and a second fan disposed adjacent to each other on the heat sink set, is provided. A projection of an area covered by the first fan during rotation on a plane where the heat sink set is located partially overlaps with a projection of an area covered by the second fan during rotation on the plane where the heat sink set is located. A rotating direction of the first fan is different from a rotating direction of the second fan. A display card assembly including a display card and aforesaid heat dissipation module is further provided. An electronic device including a main board and aforesaid display card assembly is also provided.

8 Claims, 2 Drawing Sheets

(56) References Cited

U.S. PATENT DOCUMENTS

| | | | | |
|---|---|---|---|---|
| 2004/0020449 A1* | 2/2004 | Stevens | ............... | F04D 25/166 123/41.49 |
| 2007/0121289 A1* | 5/2007 | Peng | ..................... | G06F 1/20 361/695 |
| 2009/0199791 A1* | 8/2009 | Kim | .................... | F04D 25/163 123/41.49 |
| 2011/0127017 A1 | 6/2011 | Cheng | | |

FOREIGN PATENT DOCUMENTS

| | | |
|---|---|---|
| CN | 101154198 | 4/2008 |
| EP | 0259182 | 3/1988 |
| JP | 2001269647 | 10/2001 |
| JP | 2012227258 | 11/2012 |
| KR | 20010019244 | 3/2001 |
| KR | 20120041813 | 5/2012 |
| WO | 03078848 | 9/2003 |

OTHER PUBLICATIONS

"Office Action of Taiwan Counterpart Application", dated Feb. 19, 2016, p. 1-p. 6.
"Office Action of Korea Counterpart Application," with English translation thereof, dated May 19, 2017, p. 1-p. 11.

* cited by examiner

HEAT DISSIPATION MODULE, DISPLAY CARD ASSEMBLY AND ELECTRONIC DEVICE

CROSS-REFERENCE TO RELATED APPLICATION

This present application claims the priority benefit of Taiwan application serial No. 104134117, filed on Oct. 16, 2015. The entirety of the above-mentioned patent application is hereby incorporated by reference herein and made a part of this specification.

BACKGROUND OF THE INVENTION

1. Field of the Invention

The present application relates to a heat dissipation module, a display card assembly and an electronic device, and more particularly, relates to a heat dissipation module having preferable heat dissipation efficiency, and a display card assembly and an electronic device using the heat dissipation module.

2. Description of Related Art

In recent years, with advancements in sci-tech industry, electronic devices including products such as desktop computers or notebook computers have frequently appeared in daily life. With increasingly faster operation speed of electronic components (e.g., chips) in the electronic devices, heat generated by the electronic components can only become increasingly more. Overheat often leads to malfunction, and thus the heat must be timely dissipated in order to lower the failure rate. To assist in dissipating the heat generated by the electronic devices to outside of the electronic devices, there have been various conventional solutions which mainly include, for example, passive cooling with heatsinks through thermal conduction, active cooling with fans in convective way, thermal transmission with heat pipes in phase transition, etc. Still, it has always been a goal to accomplish as how to constantly improve the heat dissipation efficiency.

SUMMARY OF THE INVENTION

According to a first aspect of the present application, a heat dissipation module capable of providing preferable heat dissipation efficiency is provided.

The heat dissipation module in the present application may include a heat sink set, a first fan and a second fan disposed adjacent to each other on the heat sink set. A projection of an area covered by the first fan during rotation on a plane where the heat sink set is located partially overlaps a projection of an area covered by the second fan during rotation on the plane where the heat sink set is located. A rotating direction of the first fan is different from a rotating direction of the second fan.

In an embodiment of the present application, each of the first fan and the second fan includes a plurality of blades. The blades of the first fan and the blades of the second fan are located on different planes.

In another embodiment of the present application, each of the first fan and the second fan includes a plurality of blades. The blades of the first fan and the blades of the second fan are located on the same plane. A shape of an end of each blade of the first fan is complementary to a shape of an end of each blade of the second fan.

Further, in such embodiment, the end of each blade of the first fan includes an upper notch and a lower protrusion located below the upper notch, and the end of each blade of the second fan includes a lower notch having a shape corresponding to the lower protrusion and an upper protrusion having a shape corresponding to the upper notch located above the lower notch.

In an embodiment of the present application, the first fan is identical to or different from the second fan in size.

In an embodiment of the present application, the heat sink set further includes a plurality of fins. The first fan and the second fan are disposed on the fins. The fins have an identical height or different heights.

In an embodiment of the present application, the heat dissipation module further includes a third fan. The first fan, the second fan and the third fan are arranged in a row, where the second fan is located between the first fan and the third fan. The rotating direction of the second fan is different from the rotating direction of the first fan and a rotating direction of the third fan.

According to a second aspect of the present application, a display card assembly having aforesaid heat dissipation module is also provided.

The display card assembly in the present application may include a display card and the heat dissipation module. The heat dissipation module is disposed on the display card.

In an embodiment of the present application, the heat dissipation module includes the first fan, the second fan and the third fan which are arranged in a row. The second fan located at a center rotates in clockwise direction and the first fan and the third fan rotate in counterclockwise direction.

According to a third aspect of the present application, an electronic device having aforesaid display card assembly is further provided.

The electronic device in the present application includes a main board and the display card assembly. The display card assembly is electrically connected to the main board.

In an embodiment of the present application, the main board includes a slot. The display card assembly is electrically connected to the main board through the slot. The first fan near the slot rotates in counterclockwise direction and the second fan rotates in clockwise direction so that a generated airflow near the slot is moved in a direction away from the main board.

Based on the above, according to the electronic device, the display card assembly and the heat dissipation module provided in the present application, by providing the different fans rotating in different directions in the heat dissipation module, the generated airflow can be guided to a specific direction, so as to reduce airflow collision and effectively lower flow resistance, thereby improving the heat dissipation efficiency. Further, according to the electronic device, the display card assembly and the heat dissipation module provided in the present application, by allowing the two adjacent fans to partially overlap with each other in the heat dissipation module, fans with larger size may be adopted to be disposed in a limited space to further improve the heat dissipation.

To make the above features and advantages of the present application more comprehensible, several embodiments accompanied with drawings are described in detail as follows.

BRIEF DESCRIPTION OF THE DRAWINGS

The accompanying drawings are included to provide a further understanding of the present application, and are incorporated in and constitute a part of this specification. The drawings illustrate embodiments of the present application and, together with the description, serve to explain the principles of the present application.

DESCRIPTION OF THE EMBODIMENTS

Figure 1:
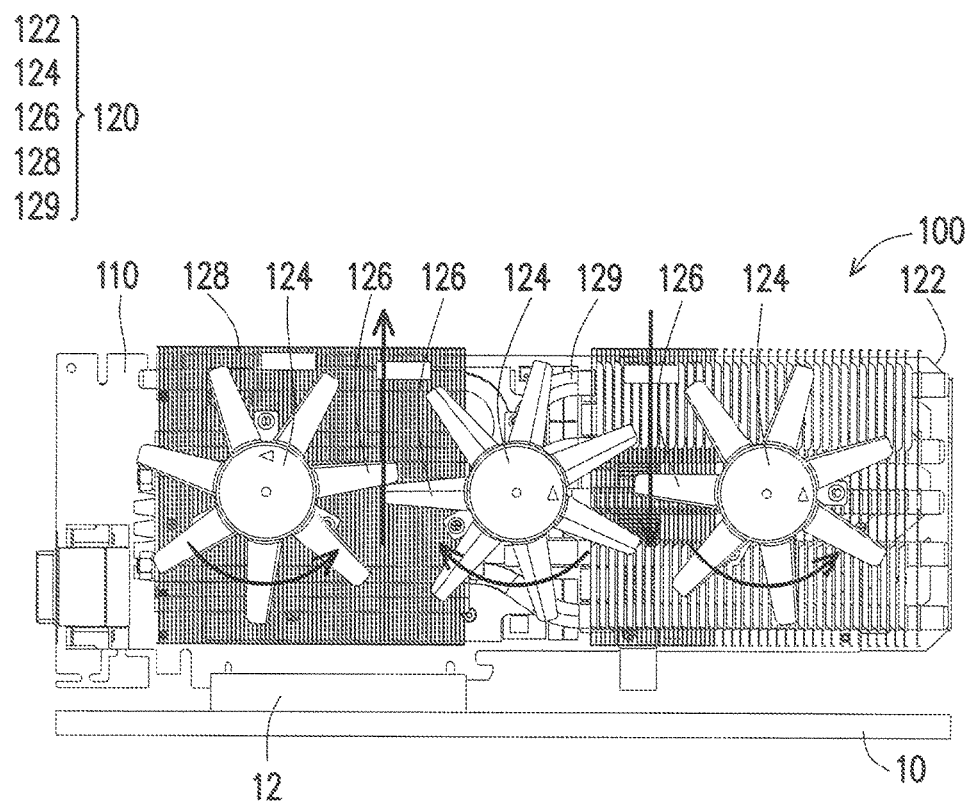
FIG. 1 is a schematic diagram of a display card assembly vertically inserted on a main board of an electronic device according to an embodiment of the present application.

Reference will now be made in detail to the present preferred embodiments of the present application, examples of which are illustrated in the accompanying drawings. Wherever possible, the same reference numbers are used in the drawings and the description to refer to the same or like parts.

Figure 2:
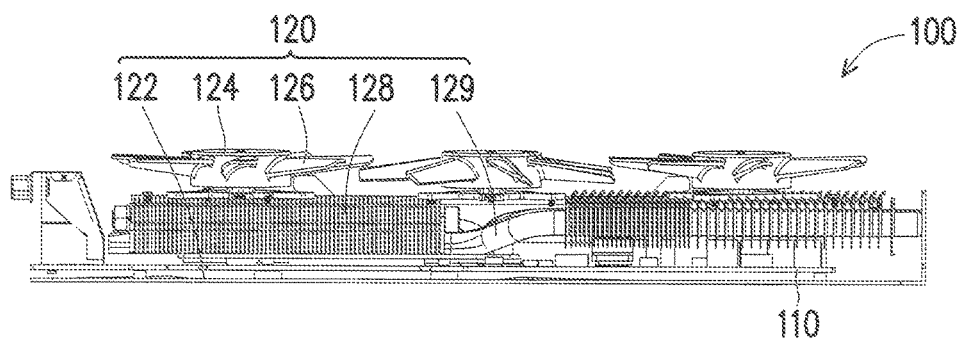
FIG. 2 is a schematic diagram of a heat dissipation module of FIG. 1 from another perspective.

As shown in FIG. 1, an embodiment of the present application provides an electronic device, which may include a main board 10 and a display card assembly 100 electrically connected to the main board 10. In the drawing, the display card assembly 100 is vertically inserted on the main board 10. FIG. 2 is a schematic diagram of a heat dissipation module 120 of FIG. 1 from another perspective. It should be noted that, for clarity, only the display card assembly 100 and the main board 10 and the relative positions thereof are shown in FIG. 1, and other components in the electronic device are omitted intentionally; however those skilled in the art may appreciate that the electronic device may have other components such as CPU, memory chips, etc.

Referring to FIG. 1 and FIG. 2, in the present embodiment, the electronic device is, for example, a desktop computer, but the type of electronic device is not limited thereto. Further, the heat dissipation module 120 of the present embodiment is applied on the display card assembly 100, for example. Nevertheless, the heat dissipation module 120 may also be disposed on other heat producing elements such as a processor or a memory module. In the present embodiment, the display card assembly 100 may include a display card 110 and the heat dissipation module 120 disposed on the display card 110. The heat dissipation module 120 may include at least two fans 124 and a heat sink set 128. The at least two fans 124 are installed on the heat sink set 128. As shown in FIG. 1, the display card 110 of the display card assembly 100 is vertically inserted into a slot 12 of the main board 10 so that the fans 124 are straighten up relative to the slot 12, and the display card 110 is electrically connected to the main board 10 through the slot 12.

In the present embodiment, there are, for example, three fans 124; however those skilled in the art may adopt more or two fans. The three fans 124 may be arranged in a row, and each of which may include a plurality of blades 126. The blades of the fan make the air nearby flow due to their rotation, thereby forming an airflow. A vortex may be formed because of airflow collision produced when the fans run together, which may lead to generation of a stagnant zone for the airflow. In the stagnant zone, because air temperature may be increased gradually, the heat generated by the display card assembly 100 and other components on the main board 10 may be accumulated rather than being dissipated. To avoid such situation, in the present embodiment, a rotating direction of the fan 124 located at a center is designed to be different from rotating directions of the two fans 124 located at two sides. In other words, two adjacent fans rotate in different directions, so that the airflow formed between the two adjacent fans 124 may be guided to a certain direction.

More specifically, as can be seen from FIG. 1, the fan 124 on the left rotates in counterclockwise direction and the fan 124 (i.e., the fan 124 at the center) second from the left rotates in clockwise direction, which allows these two fans 124 to collaboratively drive the airflow to move in a direction away from the main board 10 (i.e., to the top of FIG. 1). Meanwhile, the fan 124 at the right rotates in counterclockwise direction so the fan 124 at the center and the fan 124 at the right can collaboratively drive the airflow to move in a direction towards the main board 10 (i.e., the bottom of FIG. 1).

In the present embodiment, the slot 12 of the main board 10 is located below the fan 124 at the left and the fan 124 at the center, the fan 124 at the left rotates in counterclockwise direction and the fan 124 at the center rotates in clockwise direction, thereby leading the airflow move in the direction away from the main board 10. Such airflow direction may prevent the airflow from being blocked by the slot 12 or other components on the main board 10, so that the generated heat may be driven upward. Furthermore, the fan 124 at the right is suspended above the main board 10 in the present embodiment, the fan 124 at the center rotates in clockwise direction and the fan 124 at the right rotates in counterclockwise direction thereby leading the airflow move in the direction towards the main board 10. Accordingly, not only the airflow can move through space between the heat dissipation module 120 and the main board 10, the heat generated by the heat producing elements (not illustrated) on the main board 10 may also be taken away by the airflow.

It should be noted that, although three fans 124 are taken as an example in the present explanation, the number of the fans 124 is not limited thereto. In another embodiment, only two fans 124 rotated in different directions may also be adopted. For instance, the fan 124 at the left may rotate in counterclockwise direction, while the fan 124 at the right may rotate in clockwise direction. In still another embodiment, there may be more than three fans 124, where two adjacent fans 124 may rotate in different directions. In addition, the rotating directions, which can be not limited to the above description, may be decided according to the actual positions of the fans 124 relative to the main board 10. Moreover, it may also be possible to arrange the fans 124 in different rows; and the fans 124 can be located at positions decided by the space as long as the generation of the vortex may be prevented or the vortex may be reduced. In still yet another embodiment, the fans 124 may be arranged in a manner of being staggered up and down rather than being limited by what illustrated in the drawings.

In the heat dissipation module 120 of the present embodiment, by means of driving different fans 124 rotate in different directions, the airflow can be led to flow in a certain direction during rotation of two adjacent fans 124, which may reduce airflow collision and effectively lower flow resistance, thereby improving the heat dissipation efficiency.

Further, it is worth mentioning that, a case (not shown) of the electronic device generally includes a limited space. Although a better heat dissipation effect may be obtained with fans 124 having larger sizes, the fans 124 having larger sizes probably cannot be adopted due to the limited space. With the designs in the present embodiment, the fans 124 of the heat dissipation module 120 can have larger sizes to provide better heat dissipation efficiency, which would be described as follows.

In the present embodiment, a projected area of one fan 124 in operation on a plane where the heat sink set 128 is may partially overlap with a projected area of another fan 124 in operation on the plane. Specifically, a projection of an area covered by one fan 124 of the heat dissipation module 120 during rotation on the plane where the heat sink set 128 is located may partially overlap with a projection of an area covered by another fan 124 during rotation on the plane where the heat sink set 128 is located. For instance, from the perspective of FIG. 1, the areas covered by the fan 124 located at the left and the fan 124 located at the center during rotation partially overlap with each other, and the areas covered by the fan 124 located at the center and the fan 124 located at the right during rotation partially overlap with each other.

In the present embodiment, the blades 126 of two adjacent fans 124 are located on different planes. In this way, even though the projections of the areas covered by the blades 126 of the two adjacent fans 124 in rotation on the plane where the heat sink set 128 is located partially overlap with each other, the blades 126 of the two adjacent fans 124 may not bump against each other during rotation. In another embodiment, though the fans 124 are installed on the same plane, the areas covered by the blades 126 of the two adjacent fans 124 in rotation can partially overlap with each other by adjusting positions or shapes of the blades 126 of each fan 124.

More particularly, in the embodiment shown in FIG. 2, the blades 126 of the fan 124 at the center are located at a lower position relative to the blades 126 of the fans 124 at two sides; that is, the blades 126 of the fans 124 at two sides may be located on a higher position. With the fans 124 disposed in the manner of staggered up and down to each other in the heat dissipation module 120, fans 124 having larger sizes may be adopted to install at one side of the display card 110 having a limited space, which may improve the heat dissipation efficiency. Naturally, in another embodiment, it is also possible to locate the blades 126 of the center fan 124 at a higher position and the blades 126 of the fans 124 at two sides at a lower position. Alternatively, in still another embodiment, the blades 126 of the three fans 124 may also be located on different horizontal planes respectively or can be located based on the space in the case. In still yet another embodiment, the fans 124 may also be directly installed on different planes rather than setting the blades 126 at different heights.

Moreover, in the embodiment shown in FIG. 2, the heat sink set 128 below the three fans 124 has a plurality of fins with an identical height. In another embodiment, the heat sink set 128 may also have a plurality of fins with different heights, and the fans 124 may be located on the different horizontal planes by taking advantage of the fins having different heights.

It is worth mentioning that, in an embodiment of the present application, because the two adjacent fans 124 partially overlap with each other, when one of them goes wrong and another runs normally, the airflow generated by the blades 126 of the normal fan 124 during rotation can still drive the blades 126 of the broken fan 124 to rotate, so that the overall heat dissipation efficiency of the fans 124 can still be maintained at a certain degree.

It should be noted that, in an embodiment of the present application, the sizes of the fans 124 are identical. Nonetheless, in other embodiments, the sizes of the fans 124 may also be different. For instance, the size of the fan 124 located at the center may also be greater than the sizes of the two fans 124 at two sides, and the sizes of the fans 124 are not limited by what illustrated in the drawings.

Figure 3:
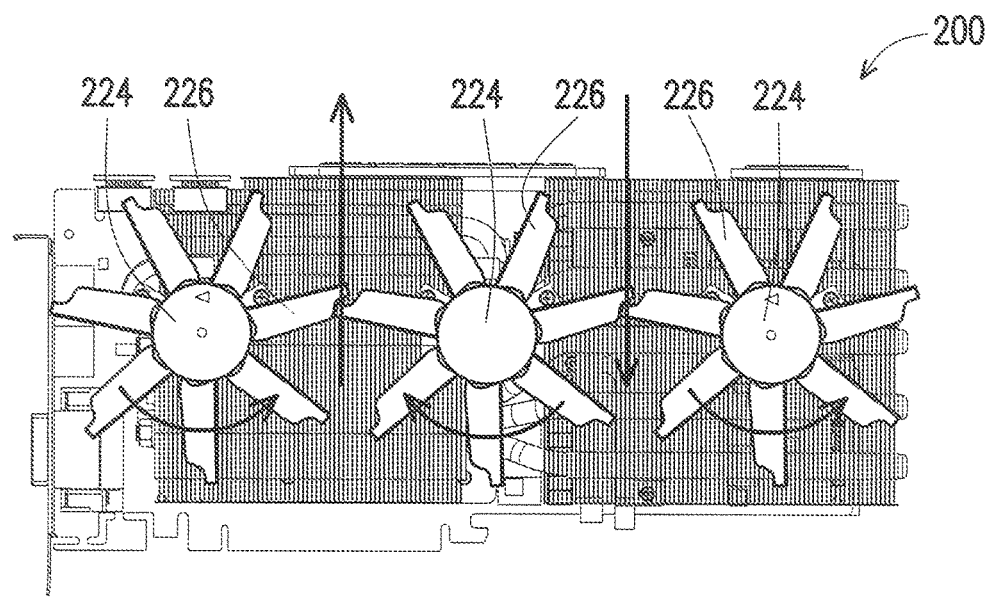
FIG. 3 is a schematic diagram of a display card assembly according to another embodiment of the present application.
Figure 4:
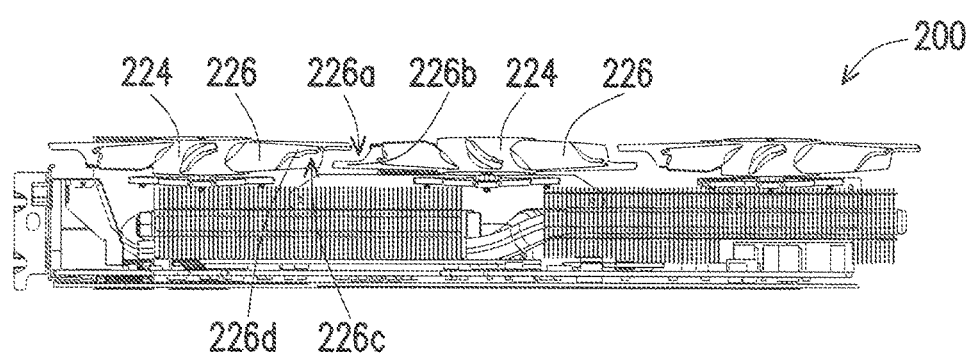
FIG. 4 is a schematic diagram of the display card assembly of FIG. 3 from another perspective.

FIG. 3 is a schematic diagram of a display card assembly according to another embodiment of the present application. FIG. 4 is a schematic diagram of the display card assembly of FIG. 3 from another perspective. Referring to FIG. 3 and FIG. 4, a major difference between a display card assembly 200 of the present embodiment and the display card assembly 100 of FIG. 1 is that, as shown in FIG. 4, blades 226 of three fans 224 are located on the same plane in the present embodiment, and a shape of an end of each blade of one fan is complementary to a shape of an end of each blade of adjacent fan. For example, in one specific implementation, the end of each blade 226 of the fan 224 located at the center may include an upper notch 226a and a lower protrusion 226b located below the upper notch 226a, while the end of each blade 226 of the two fans 224 located at two sides may include a lower notch 226c having a shape corresponding to the lower protrusion 226b and an upper protrusion 226d located below the lower notch 226c, where the upper protrusion 226d may have a shape corresponding to the upper notch 226a.

In other words, by taking advantage of the complementary shapes of the lower notch 226c and the upper protrusion 226d, as well as the complementary shapes of the upper notch 226a and the lower protrusion 226b, two adjacent fans 224 in operation may, without interference, be partially overlapped one another in the areas covered by themselves through blades 226.

Naturally, in other embodiments, it is also possible that the end of each blade 226 of the two fans 224 located at two sides includes the upper notch 226a and the lower protrusion 226b located below the upper notch 226a, while the end of each blade 226 of the fan 224 located at the center includes the lower notch 226c having a shape corresponding to the lower protrusion 226b and the upper protrusion 226d having a shape corresponding to the upper notch 226a located above the lower notch 226c. Shapes and positions of the upper notch 226a and the lower notch 226c are not limited by what illustrated in the drawings.

In summary, according to the electronic device, the display card assembly and the heat dissipation module provided in the present application, by providing the different fans rotating in different directions in the heat dissipation module, the generated airflow can be guided to the specific direction to reduce airflow collision and effectively lower flow resistance, thereby improving the heat dissipation efficiency. Further, according to the electronic device, the display card assembly and the heat dissipation module provided in the present application, by allowing the two adjacent fans to partially overlap with each other in the heat dissipation module, the fan with larger size may be disposed in the limited space to further improve the heat dissipation.

It will be apparent to those skilled in the art that various modifications and variations can be made to the structure of the present application without departing from the scope or spirit of the present application. In view of the foregoing, it is intended that the present application cover modifications and variations of this application provided they fall within the scope of the following claims and their equivalents.

What is claimed is:

1. A heat dissipation module, comprising: a heat sink set; and a first fan and a second fan disposed adjacent to each other on the heat sink set, wherein each of the first fan and the second fan comprises a plurality of blades, the blades of the first fan and the blades of the second fan are located on the same plane, and a shape of an end of each blade of the first fan is complementary to a shape of an end of each blade of the second fan, and a projection of an area covered by the first fan during rotation on a plane where the heat sink set is located partially overlaps with a projection of an area covered by the second fan during rotation on the plane where the heat sink set is located, and a rotating direction of the first fan is different from a rotating direction of the second fan; wherein the end of each blade of the first fan comprises an upper notch and a lower protrusion located below the upper notch, and the end of each blade of the second fan comprises a lower notch having a shape corresponding to the lower protrusion and an upper protrusion having a shape corresponding to the upper notch located above the lower notch.

2. The heat dissipation module according to claim 1, wherein sizes of the fans are identical or different.

3. The heat dissipation module according to claim 1, wherein the heat sink set comprises a plurality of fins, the first fan and the second fan are disposed on the fins, and the fins have an identical height or different heights.

4. The heat dissipation module according to claim 1, further comprising: a third fan arranged in a row with the first fan and the second fan, the rotating direction of the second fan located at a center being different from the rotating direction of the first fan located at a side and a rotating direction of the third fan located at another sides.

5. A display card assembly, comprising:
a display card, and
the heat dissipation module according to claim 1, the heat dissipation module being disposed on the display card.

6. The display card assembly according to claim 5, wherein the heat dissipation module further comprises a third fan, when the first fan, the second fan and the third fan are arranged in a row, the second fan located at a center rotates in clockwise direction and the first fan and the third fan located at two sides rotate in counterclockwise direction, or the second fan located at a center rotates in counterclockwise direction and the first fan and the third fan located at two sides rotate in clockwise direction.

7. An electronic device, comprising a main board, and the display card assembly according to the claim 5, the display card assembly being electrically connected to the main board.

8. The electronic device according to claim 7, wherein the main board comprises a slot, the display card assembly is electrically connected to the main board through the slot, the first fan near the slot rotates in a direction different from the second fan so that an airflow generated near the slot is moved in a direction away from the main board.

* * * * *